US012354895B2

(12) United States Patent
Peng et al.

(10) Patent No.: US 12,354,895 B2
(45) Date of Patent: Jul. 8, 2025

(54) ENCAPSULATED RFID IN CONSUMABLE CHAMBER PARTS

(71) Applicant: Lam Research Corporation, Fremont, CA (US)

(72) Inventors: Gordon Peng, San Jose, CA (US); Yu Jiang, San Jose, CA (US); David Celli, Pleasanton, CA (US); Steve Askin, Tracy, CA (US)

(73) Assignee: Lam Research Corporation, Fremont, CA (US)

( * ) Notice: Subject to any disclaimer, the term of this patent is extended or adjusted under 35 U.S.C. 154(b) by 153 days.

(21) Appl. No.: 17/782,588

(22) PCT Filed: Dec. 11, 2020

(86) PCT No.: PCT/US2020/064519
§ 371 (c)(1),
(2) Date: Jun. 3, 2022

(87) PCT Pub. No.: WO2021/126696
PCT Pub. Date: Jun. 24, 2021

(65) Prior Publication Data
US 2023/0011537 A1  Jan. 12, 2023

Related U.S. Application Data

(60) Provisional application No. 62/950,449, filed on Dec. 19, 2019.

(51) Int. Cl.
*H01L 21/67* (2006.01)
*H01J 37/32* (2006.01)

(52) U.S. Cl.
CPC .. *H01L 21/67294* (2013.01); *H01J 37/32642* (2013.01); *H01J 37/32807* (2013.01)

(58) Field of Classification Search
CPC .......... H01J 37/32642; H01J 37/32431; H01J 37/32908; H01J 37/32807; H01L 21/67294
(Continued)

(56) References Cited

U.S. PATENT DOCUMENTS 6,198,616 B1 *  3/2001  Dahimene ........... H01L 21/6831
                                                                      279/128
2002/0133942 A1 *  9/2002  Kenison ........... G06K 19/07745
                                                                      29/841
(Continued)

FOREIGN PATENT DOCUMENTS

CA          2957526 A1 *  2/2016  ........... A01N 1/0263
KR      10-1876548 B1     7/2018
WO  WO-2005119616 A1 * 12/2005  ............. B64F 1/368

OTHER PUBLICATIONS

ISR & Written Opinion PCT/US2020/064519, dated Mar. 29, 2021, 11 pages.

*Primary Examiner* — Yong Hang Jiang
(74) *Attorney, Agent, or Firm* — PENILLA IP, APC

(57) ABSTRACT

A consumable part and methods for tracking the consumable part includes embedding a radio frequency tag within a pocket created on a side of the consumable part that faces away from a process region defined within a process chamber of the processing tool and covering an opening of the pocket using a plug. The plug is laser fused along an interface formed between sidewalls of the plug and sidewalls of the pocket.

13 Claims, 9 Drawing Sheets

(58) Field of Classification Search
USPC .......................................................... 340/10.1
See application file for complete search history.

(56) References Cited

U.S. PATENT DOCUMENTS

| | | | | |
|---|---|---|---|---|
| 2005/0108995 | A1* | 5/2005 | Chudoba | B65D 35/10 |
| | | | | 53/284 |
| 2006/0283552 | A1 | 12/2006 | Rogers | |
| 2007/0012117 | A1* | 1/2007 | Hiroki | F16J 15/064 |
| | | | | 73/768 |
| 2015/0356398 | A1* | 12/2015 | Morris | G06K 19/0772 |
| | | | | 29/601 |
| 2016/0216185 | A1* | 7/2016 | Gottscho | H01J 37/3299 |
| 2017/0053819 | A1 | 2/2017 | Richardson | |
| 2017/0287682 | A1* | 10/2017 | Musselman | H01L 21/68735 |
| 2018/0061696 | A1* | 3/2018 | D'Ambra | G01N 21/64 |
| 2019/0252234 | A1 | 8/2019 | Genetti et al. | |
| 2020/0393242 | A1* | 12/2020 | Vishwanath | H01L 21/68742 |
| 2022/0119954 | A1* | 4/2022 | Chen | H01J 37/32146 |

* cited by examiner

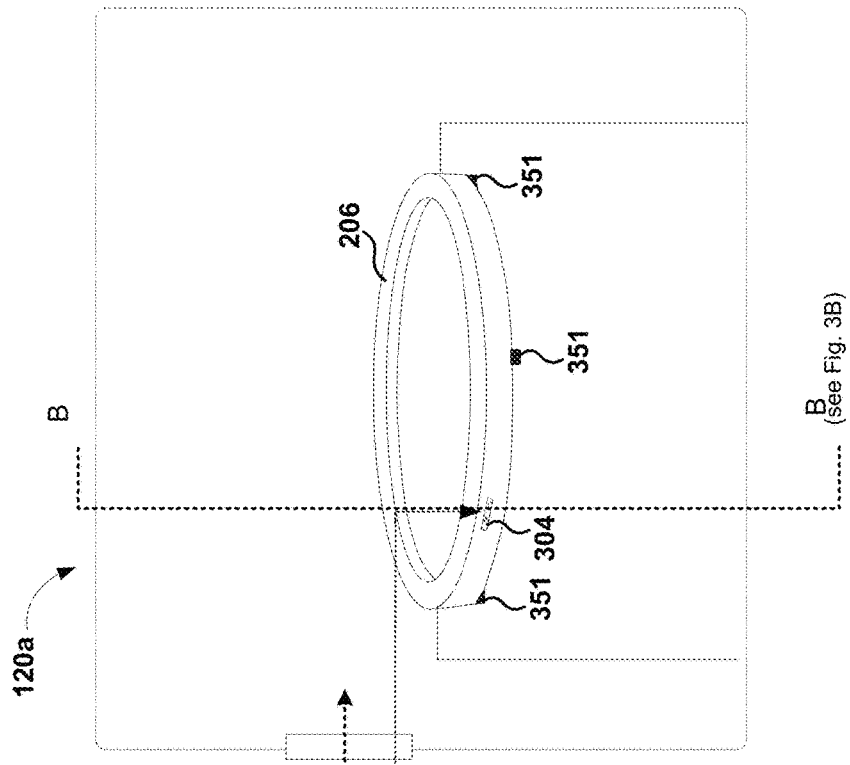
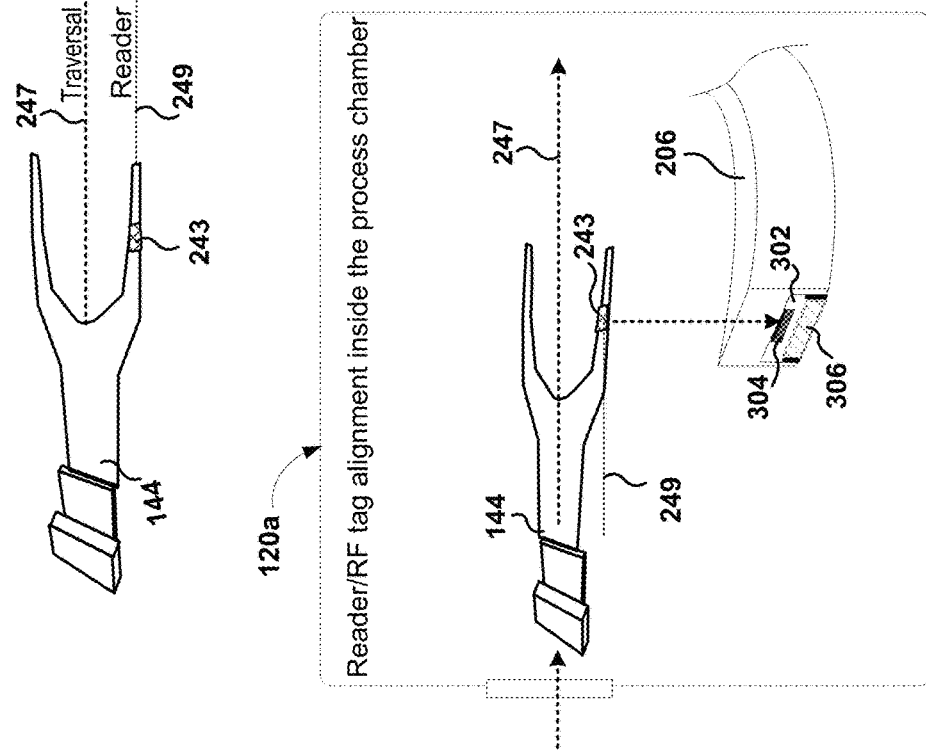

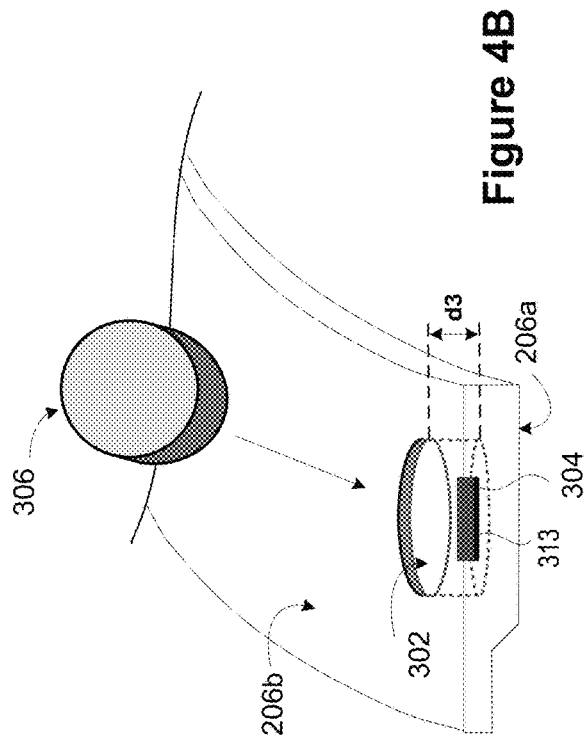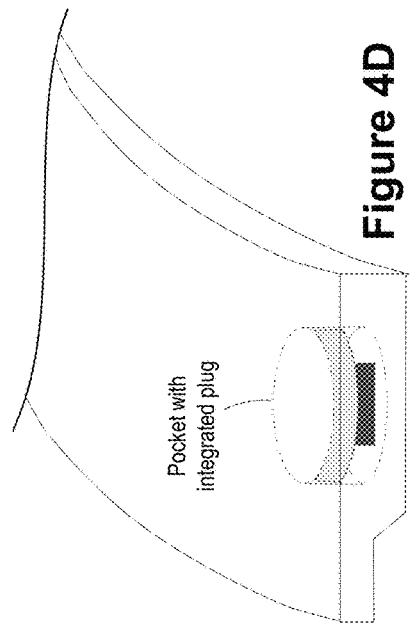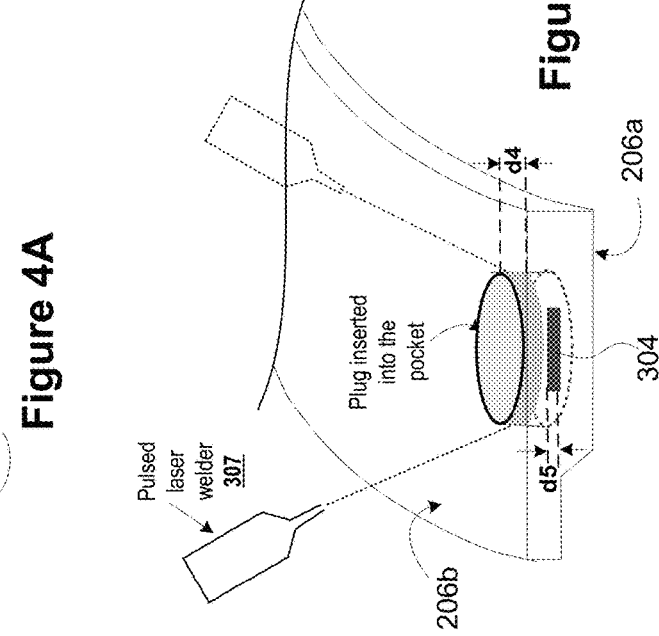

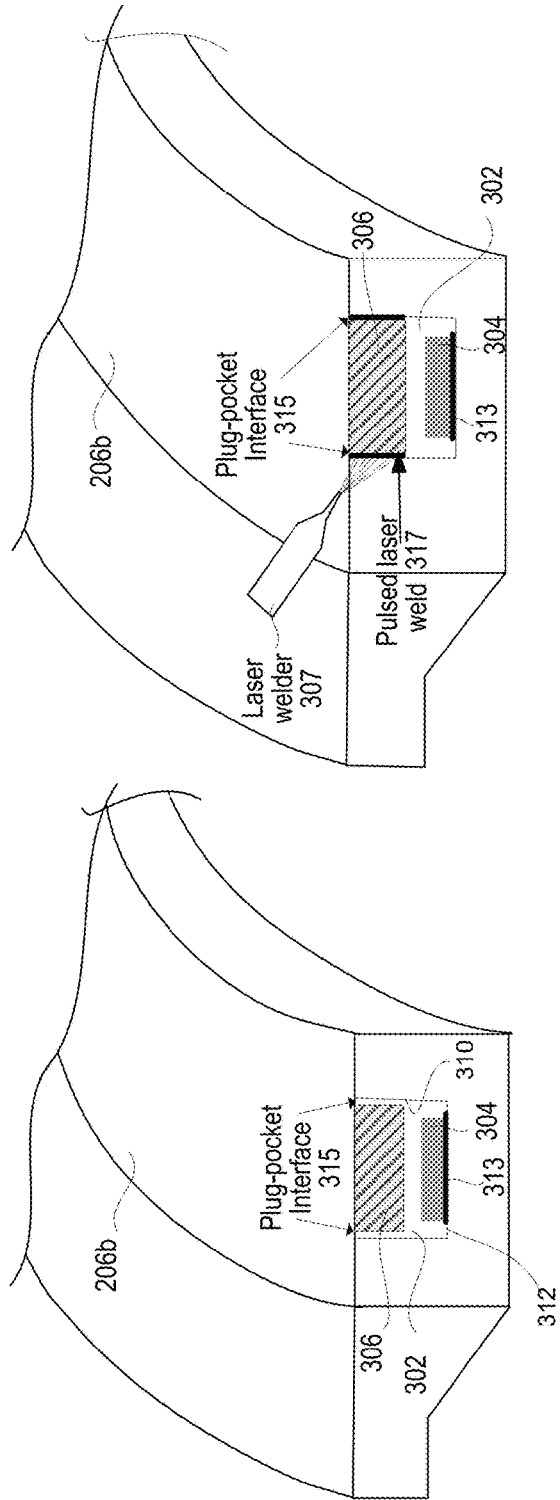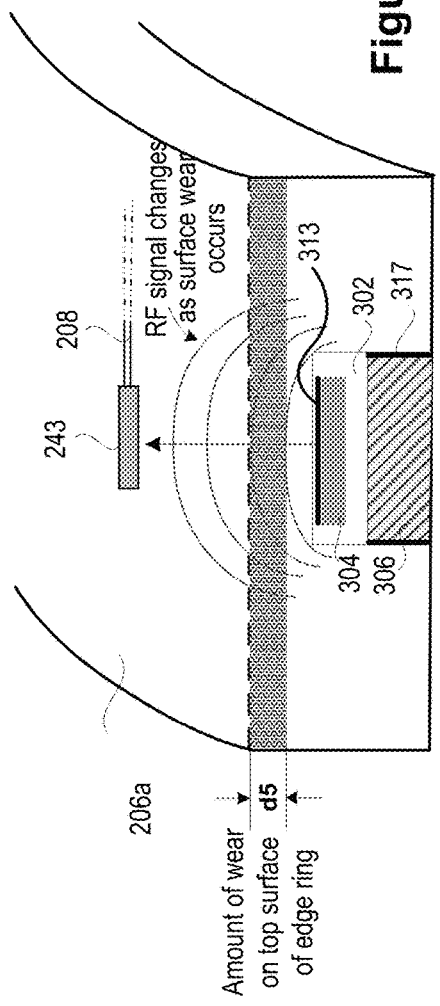

ENCAPSULATED RFID IN CONSUMABLE CHAMBER PARTS

CLAIM OF PRIORITY

This application is a national stage filing of and claims priority, under 35 U.S.C. § 371, to PCT/US20/64519, filed on Dec. 11, 2020, and titled "ENCAPSULATED RFID IN CONSUMABLE CHAMBER PARTS", which claims the benefit of and priority, under 35 U.S.C. § 119 (e), to Provisional Patent Application No. 62/950,449, filed on Dec. 19, 2019, and titled "ENCAPSULATED RFID IN CONSUMABLE CHAMBER PARTS", both of which are incorporated by reference herein in their entirety.

BACKGROUND

1. Field of the Invention

The present embodiments relates to methods, systems, and programs for tracking a consumable part in semiconductor manufacturing equipment.

2. Description of the Related Art

Substrates (e.g., wafers, flat panels) are subjected to various types of processing to form electronic products, such as integrated circuits, flat panel displays, etc. Substrates are placed in a process chamber and subjected to different processing operations, such as plasma etch, cleaning, deposition, etc., that expose the surface of the substrate to different chemistries. For example, during plasma etch operation, selective portions of the surface of the substrate are exposed to the plasma. The selective portions are exposed by placing a photoresist mask layer on the substrate surface and subjecting the substrate to plasma etch, so as to allow the plasma etch to remove underlying materials that are not covered by the photoresist. Similarly, the substrate may undergo cleaning within the same process chamber or in a different process chamber, wherein the substrate is treated with cleaning chemistries to remove the by-products that remain on the surface of the substrate from different processing operations.

The one or more processing operations performed in the process chamber exposes the various parts of the process chamber to the harsh chemistries used within the respective process chamber. In a production environment, a single etch chamber, for example, may be used for multiple etch processes, each potentially using a chemistry that can have a different impact on the wear rate of the different chamber parts. Based on the wear rate (i.e., consumption rate), each of these parts is defined to have a certain amount of useful lifetime after which the part needs to be replaced, hence leading these parts to be named as "consumable" parts. Based on the type of part, the parts' location and amount of exposure to the harsh chemistries used in the process chamber, some system administrators define the lifetime of each consumable part in terms of different numbers—the number of chamber processing hours, number of wafers run, etc., or out-of-specification wafer metrology data. These numbers are mostly defined based on the specifications of the consumable part. As a result, when the specifications vary, the numbers also vary. For example, the specifications may vary for a particular type of consumable part (e.g., edge ring) used within a process chamber, and such variations may be based on geometry, thickness, type of material used, etc. Different consumable parts in the process chamber may be made of different materials and, hence, may wear at different rates. As a result, it is desirable to keep track of the type and state of the consumable parts used in each process chamber in order to realize optimal process results.

Current tracking of consumable parts relies on part numbers that are engraved on the consumable parts. However, over the part's lifetime, these visual markings can be compromised through etching and/or refurbishment cleaning. Further, these engravings can be easily tampered. If these engravings are provided on the underside of the consumable part, then tracking these consumable parts can only be done by opening the process chamber, removing the consumable part, and reading/scanning the engraved part number. This leads to significant downtime, as the consumable part needs to be re-set correctly in the process chamber and the process chamber has to be conditioned before use.

It is in this context that embodiments arise.

SUMMARY

Methods, devices, systems, and computer programs are presented for tracking a consumable part used in a process chamber within a semiconductor process system. It should be appreciated that the present embodiments can be implemented in numerous ways, such as a method, an apparatus, a system, a device, or a computer program on a computer readable medium. Several embodiments are described below.

The semiconductor process system may be a cluster tool that includes a plurality of process chambers that are used to perform different process operations on a surface of a substrate to define electronic devices. One or more of the process chambers may use process chemistries for performing process operations, such as plasma etch, cleaning, etc. The process chambers include a plurality of consumable parts that are configured to supply process chemistry, supply power, contain the process chemistry within a process region, extend the processing region on the wafer, and/or remove by-products and impurities. These consumable parts are exposed to the process chemistry and need to be tracked to ensure that, (a) the consumable parts that are being used are compatible with the process chamber, (b) the wear on the consumable parts is below a level that requires replacement, and (c) the consumable parts are performing at optimal level. Some examples of the parts that may get exposed to process chemistry in the process chamber include focus rings, edge rings, inner liners, back shadow rings, electrostatic chuck or pedestal that is used for receiving a substrate for processing, chamber walls, plasma containment components (e.g., C-shroud, confinement rings, etc.), etc., whose surfaces may wear away over time due to exposure to the process chemistry, and need to be replaced.

Specific implementations of tracking a consumable part include embedding a radio frequency (RF) tag within the consumable part used in a process chamber. The RF tag is embedded within a pocket defined on a side of the consumable part that is facing away from a process region where process chemistry is present. A plug is used to provide an air-tight seal of an opening of the pocket. The air-tight seal acts to insulate the RF tag from any process chemistry, by-products, or radicals that make their way toward the opening of the pocket. A depth of the pocket is defined such that there is sufficient amount of the consumable part left on the side experiencing wear due to exposure of the side of the consumable part to the process chemistry, during a lifetime of the consumable part.

The RF tag includes the identification information of the consumable part. The RF tag, in some implementations, is an encapsulated, passive RF tag that enables verification of the consumable part using the labeling information included therein, upon getting activated by a RF reader. The plug that seals the opening of a pocket provides sufficient insulation to the RF tag embedded within. The RF tag can be activated from the side facing the processing region and identification information read using a RF reader so that the consumable part can be easily tracked without fear of losing the tracking capability due to wear. The RF tag is hard to tamper with and, therefore, provides a reliable way to track the consumable part. In some implementations, the RF tag, embedded in a consumable part defined within a process chamber used for plasma etch, may operate at a frequency that is higher than an operating frequency used to generate the plasma in the process chamber. This allows the RF tag to be activated only when needed and not when the process chamber is operating. Keeping the operating frequency of the chamber different from the frequency at which the RF tag operates ensures that the frequency of the RF tag does not adversely impact the plasma process performed on the top of the wafer. Further, operating the RF tag at a different frequency than the operating frequency ensures that the RF tag does not get damaged from the operating frequency.

The identification information included in the RF tag may be used for auditing purposes, such as detecting which consumable part is being used in the process chamber, identifying any part mismatch within the process chamber, tracking the consumable part during the part's lifetime both within the process chamber, and when removed from the process chamber for refurbishment, cleaning, etc., and re-introduced back into the process chamber. The RF tag information may also be used to tie the consumable part to other parts used within the process chamber. The RF tag information may be fed to a computer, which may include a software system to perform the audit. RF tags may be encapsulated in different consumable parts of the process chamber, such as showerheads, inner liners, electrostatic chucks, confinement rings, edge rings, focus rings, shadow rings, etc., and these consumable parts may be part of an interlock system. In such cases, each consumable part may actively communicate with the computer of the interlock system to ensure that the consumable parts that are used in a particular process chamber are authentic and are in accordance to the specifications of the particular process chamber. The auditing provides assistance in avoiding chamber parts mismatch and in trouble shooting process issues. A RF reader is used to read the RF tag.

With the general understanding of the various features, specific implementations will now be described.

In accordance with one implementation, a consumable part for use in a process chamber used to process a wafer, is disclosed. The consumable part includes a pocket defined on a side that is facing away from a process region. The pocket extends to a first depth and has an opening. A radio frequency tag is embedded inside the pocket and is configured to generate a high frequency signal, when activated. A plug extending to a second depth covers the opening. The plug is laser fused to seal the radio frequency tag in the pocket. The laser fusion is performed along an interface defined between sidewalls of the plug and sidewalls of the pocket.

In another implementation, a method for manufacturing a trackable consumable part used in a process chamber, is disclosed. The method includes creating a pocket of a first depth on a side of the consumable part that faces away from a process region defined within a process chamber. A radio frequency (RF) tag is embedded within the pocket. An opening of the pocket is sealed using a plug of a second depth, such that a top surface of the plug is co-planar with a surface of the consumable part adjacent to the pocket. The sealing is performed via laser fusion, using a laser welder, along an interface defined between sidewalls of the plug and sidewalls of the pocket so as to provide an air-tight seal of the interface using materials from the sidewalls of the plug and the pocket. The top surface of the plug and a portion of the surface of the trackable consumable part adjacent to the opening of the pocket are polished so as to match a surface profile of remaining surface of the trackable consumable part.

In yet another implementation, a method for tracking a consumable part used in a process chamber, is disclosed. The method includes embedding a radio frequency tag within a pocket defined on a side of the consumable part that faces away from a processing region defined within the process chamber, wherein an opening of the pocket is sealed with a plug by laser fusion. The embedded radio frequency tag is activated by a reader inserted into the process chamber. Data related to the consumable part is collected by the reader via the activated radio frequency tag. The reader is coupled to a power source to power the reader and to activate the radio frequency tag. The reader is also coupled to a memory that is used for storing the data collected from the radio frequency tag. The data collected is interpreted to identify an attribute of the consumable part used in the process chamber. According to some implementations, the attribute includes information related to identification and/or usage data of the consumable part.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 3A illustrates a traversal path of an end-effector on which a RF reader is embedded for reading a RF tag embedded in a consumable part used within a process chamber, in accordance with an implementation.

FIG. 3B illustrates a RF reader-RF tag alignment inside the process chamber along the traversal path illustrated in FIG. 3A, in accordance with one implementation.

FIGS. 4A-4D illustrate the process of embedding a RF tag within a pocket defined on an underside surface of an edge ring, in accordance with one implementation.

FIG. 5A illustrates a plug-pocket interface defined between the sidewalls of the plug and the sidewalls of the pocket, in one example implementation.

FIG. 5B illustrates laser fusion of the plug to the pocket along the pocket-plug interface to provide an air-tight seal, in one implementation.

FIG. 6 illustrates a cross-sectional side view of a portion of an edge ring in which an RF tag is embedded and the changes detected in the strength of the RF signal emanating from the RF tag based on erosion of the top surface of the edge ring, in one example implementation.

DETAILED DESCRIPTION

Figure 1:
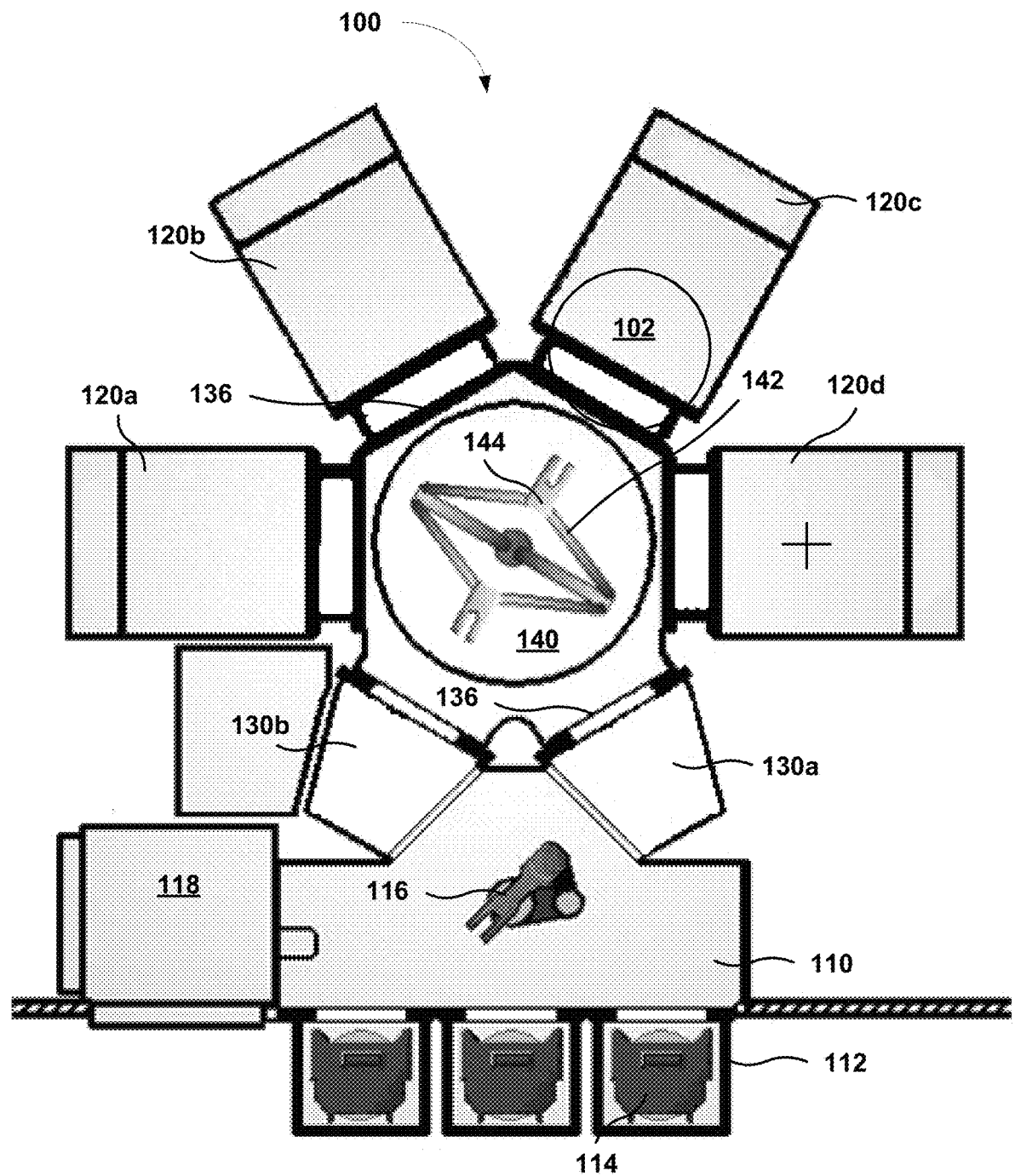
FIG. 1 illustrates an example semiconductor process cluster tool architecture having various process chambers (i.e., process modules) in which one or more consumable part includes an embedded radio frequency (RF) tag, in accordance with one implementation.

Embodiments present methods, systems, devices to embed a radio frequency (RF) tag within a consumable part, read the identification information from the RF tag and use the identification information to track the consumable part. The tracking may be used to perform audit to ensure that authentic parts are being used in the process module, to trouble shoot process issues, to determine the remaining lifetime left before a consumable part needs to be replaced, etc. The tracking of the consumable part can be done in-situ without any downtime for the process module. The RF tag is tamper-proof, thereby ensuring that the identification information and other attributes of the consumable part are not compromised. The positioning of the RF tag ensures that the information included in the RF tag is accessible and the identification information and other attributes of the consumable part can be read during the lifetime of the consumable part.

The RF tag may be an encapsulated, passive radio frequency identification (RFID) tag that can be embedded inside non-metallic chamber parts (i.e., consumable parts), such as edge rings, ground rings, shadow rings, inner liners, showerheads, etc. A RF reader disposed on an end-effector or embedded in a reader ring or on a separate probe arm may be used to activate the RF tag and read the identification information. Alternatively, the RF reader may be disposed in areas of a processing tool (e.g., within a process chamber, a load lock chamber, etc.,) through which the consumable part with the RF tag passes through or is received so as to activate the RF tag and read the identification information. The RFID implants provide several advantages over traditional engravings. Some advantages include rapid and accurate process chamber hardware configuration verification, eliminate uncertainty when authenticating various consumable parts, provide accurate measurement of lifetime left to enable efficient and effective management of consumable part inventory, where identification information is required, etc. The RFID implants thus improve processing tool operational efficiency while implementing predictive maintenance by providing accurate measurement of use of a consumable part within the processing tool and lifetime left for the consumable part. Other advantages will become apparent to one skilled in the art after reviewing the various embodiments described herein.

In some implementations, the RF tag may be an ultra-high frequency tag, and is designed to be greater than an operating frequency of the process chamber. The ultra-high frequency for reading the RF tag ensures that the RF tag does not interfere with the plasma generation or adversely affect the operating conditions in the process chamber.

Information collected from the RF tag can be used for audit purposes to ensure that the process chamber is using authentic parts. The information can also be used for chamber parts matching. Based on specification of the process chamber and the identification information of the RF tag, each consumable part is matched to a specific process chamber. The RF tag information can also be used to track a number of times a consumable part has been repaired and/or refurbished, and to reduce run-cost by optimizing part use (i.e., lifetime optimization). For instance, if a consumable part has a lifetime of about 1500 hours, and a mean time between clean is 500 hours, then the consumable part can be used for 3 process cycles after which the part can be discarded with no residual value left in the part. However, if the lifetime of the consumable part is about 1200 hours and a mean time between clean (MTBC) is about 500 hours, then the part can be used for only 2 process cycles after which there is a residual 200 hours left. In order to optimize the part usage, the consumable parts may be tracked within a process tool that includes a plurality of process chambers to determine the lifetime left for the consumable part after each cleaning or refurbishment. When the residual hours left in the consumable part is less than the MTBC of the process chamber, the consumable part may be moved to a different process chamber which has a shorter MTBC (i.e., at or close to the residual hours left) for the consumable part, in order to optimize usage of the consumable part. Additionally, the consumable part tracking may be used for inventory management.

With the general understanding of the inventive embodiments, example details of the various implementations will now be described with reference to the various drawings.

FIG. 1 illustrates an example of a semiconductor process tool architecture. The semiconductor process tool 100, as shown, includes a number of process modules and airlock(s) that are coupled to a vacuum transfer module (VTM) 140 through a corresponding interface. The interface could include a gate valve that provides controlled access to the respective process module. The clustering of modules, such as process modules and airlocks, around the VTM enables wafers to be transferred from one process module to another, under vacuum, using a robot 142 of the VTM 140, and hence is also referred to as a "cluster tool assembly" or simply "cluster tool". The Airlock 130 (also referred to as a loadlock) of the cluster tool 100, assists in transferring the wafers from an atmospheric transfer module (ATM) 110 maintained at atmospheric conditions to the VTM 140 maintained in vacuum and is, therefore, also referred to as a "transfer module". The cluster tool 100 is shown to include four process modules 120a-120d, with each process module configured to perform various fabrication operations or may be individually optimized to perform a distinct fabrication operation. By way of example, processing modules 120a, 120b, 120c, 120d may be individually implemented to perform transformer coupled plasma (TCP) substrate etching, layer depositions, and/or sputtering. Each process module has a facet 136 that defines an interface between the process module and the VTM 140. The facet 136 may include a gate valve that may be operated by a controller. One or more sensors disposed on the facet 136 can be used to detect passing of substrate 102 or a consumable part, such as an edge ring, when going in and out of the respective process module.

Robot 142 of the VTM 140 is used to transfer the substrate 102 and/or consumable part, such as edge ring, from one process module to another process module, or between an airlock 130 and a process module. The robot 142, in one embodiment, has one arm. In another embodiment, the robot 142 has two arms. Each arm of the robot 142 has an end-effector 144 that is used to transfer the wafers and/or consumable parts between the airlock 130 and a process module (any one of process modules 120a-120d) or between the process modules 120a-120d.

The ATM 110 may also be equipped with a robot (i.e., front-end robot) 116 that may be used to transfer wafers or consumable part from a cassette/Front Opening Unified Pod (FOUP) 114 or a Front Opening Ring Pod (FORP) (not shown) received at a load port 112 to airlock 130. The front-end robot 116 may use an aligner 118 in the ATM 110 to align the wafers and/or the consumable part before the wafer/consumable part is transferred to the airlock 130.

A controller may be coupled to the cluster tool 100 to control the movement of the wafer or the consumable part within the cluster tool 100. The controller may be part of a computer that is local to the cluster tool 100, or may be located somewhere in the manufacturing floor, or in a remote location, and connected to the cluster tool 100 via a network.

One or more of the process modules 120a-120d within the cluster tool 100 may include one or more consumable parts in which a radio frequency (RF) tag is embedded. The RF tag is a passive tag that gets energized by a RF reader, when the RF reader is brought in proximity to the tag. The RF tag includes identification information that can be used to track the consumable part. The identification information may be used to perform audit, determine chamber matching, identify repair or refurbishment statistics to determine when the consumable part needs to be discarded/replaced, consumable part inventory management, to name a few. Details of the placement of the RF tag on the consumable part and reading the identification information included in the RF tag will be discussed in detail with reference to FIGS. 2 through 7.

It will be apparent, that the present embodiments may be practiced without some or all of these specific details. In other instances, well-known process operations have not been described in detail in order not to unnecessarily obscure the present embodiments.

Figure 2A:
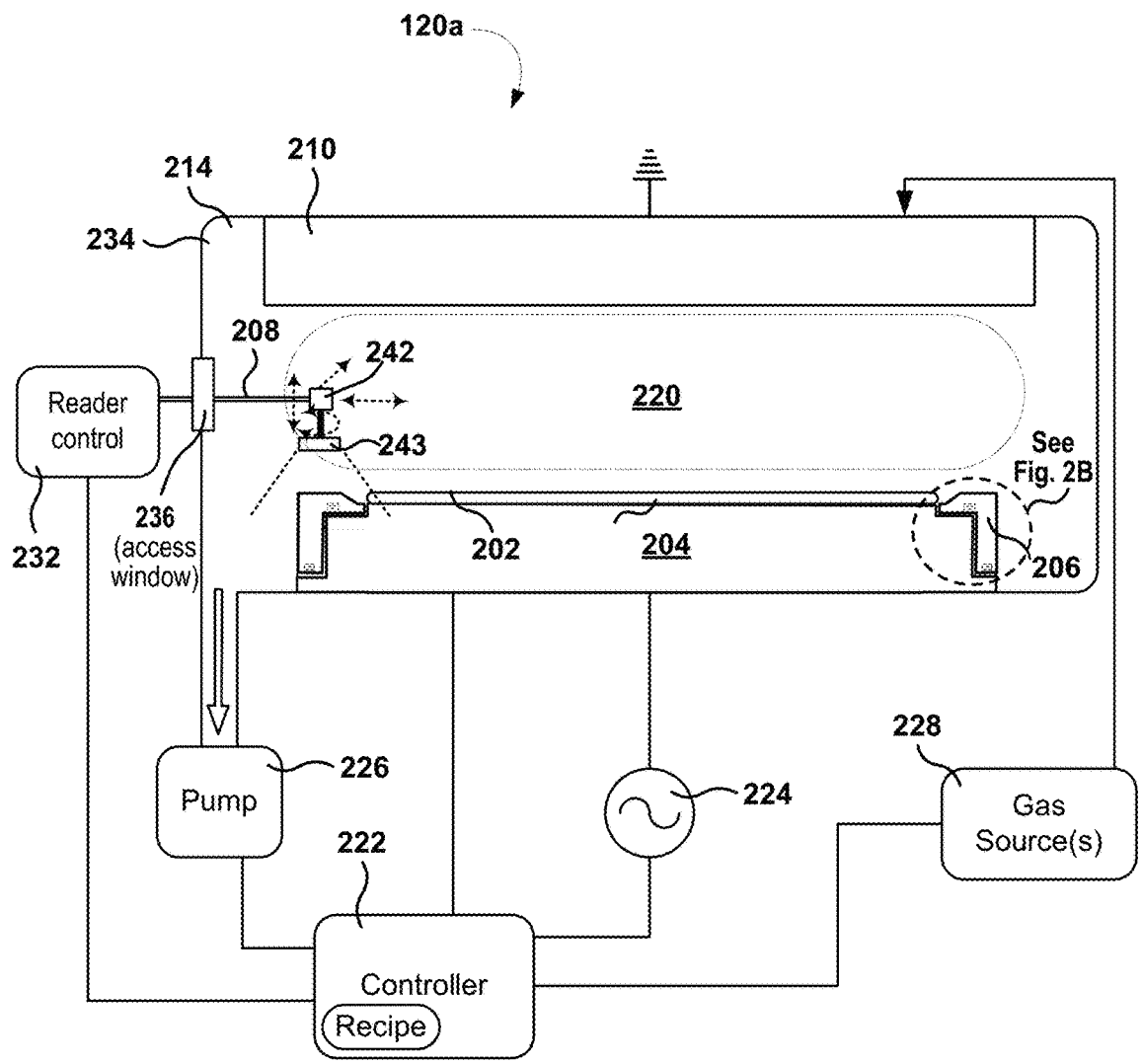
FIG. 2A illustrates a simplified block diagram of a process module that includes a consumable part with an embedded RF tag used for tracking the consumable part, in one implementation.

FIG. 2A illustrates a process module 120a that is configured to perform a plasma etch. In one implementation, the process module 120a may be a capacitive coupled plasma processing system. The capacitive coupled plasma processing system includes a chamber 214 for generating plasma. The chamber 214 includes an upper electrode, such as a showerhead 210, and a lower electrode (i.e., wafer support module 204), such as a pedestal or an electrostatic chuck (ESC). In the implementation shown in FIG. 2A, the showerhead 210 is shown to be grounded, and the wafer support module 204 is coupled to a RF power source. In an alternate implementation, the showerhead 210 could be biased or may be coupled to a second RF source (not shown) and may be powered. The showerhead 210 is connected to one or more gas sources 228, which are coupled to a controller 222. The controller 222 may generate a signal to cause the RF source 224 to provide an RF signal to the wafer support module 204, and the gas source(s) 228 to inject the desired process gas(es) into a plasma processing region 220 of the chamber 214 for generating the plasma. The desired process gas(es) may be based on the recipe used in the process chamber 214 and controlled by the controller 222. A plasma is generated in the plasma processing region 220 defined between the showerhead 210 and the wafer support module 204. The plasma may be used to etch the surface of the wafer or volatilize deposits formed on different surfaces of the chamber 214.

The wafer support module 204 provides a surface for receiving and supporting the wafer 202 (also referred to as a "substrate") that is to be processed. An edge ring 206 is configured to be disposed on the wafer support module 204 such that it is adjacent to the wafer 202, when the wafer is received on the wafer support module 204. A chamber sidewall 234 extends the lateral length of the chamber 214. An access window 236 is defined along the chamber sidewall of the chamber 214 to move the wafer into and out of the process chamber. In one implementation, an inner liner (not shown) may be defined on the inside surface of the chamber sidewall 234 to protect the sidewall of the chamber. In such implementation, a window may be defined on the inner liner to align with the corresponding opening of the access window 236 defined on the chamber sidewall 234. The access window 236 may be used to introduce a transfer arm 208 with a probe 240 having one or more RF readers 243 or an end-effector of a robot arm into the chamber during operation. In some implementations, a view port used to monitor inside conditions of the chamber may be used to introduce the transfer arm 208 or the end-effector with the RF reader 243 into the chamber. The view port may be defined above or below access window 236 defined on the chamber sidewalls 234. In the implementation where the transfer arm 208 is used, the transfer arm 208 is coupled to a reader control 232 that is used to control movement of the probe 240 within the chamber 214. The reader control 232, in turn, is coupled to the controller 222, which provides appropriate signal to control the movement of the RF reader 243 within the process module. In the implementation where the end-effector of a robot arm is used, the robot is coupled to the controller 222 to control the movement of the robot arm with the end-effector.

In one embodiment, the RF reader 243 is configured to activate any RF tags included in one or more consumable parts located within the chamber 214 and read the tag information. The RF reader 243 may include a power source and a memory. The power source is configured to provide power to the RF reader and to the one or more RF tags, and the memory is used to store the data related to the consumable parts collected from the RF tags. The data collected by the RF reader 243 is forwarded to the controller 222. The controller 222 may use the data from the RF tags to identify/define attributes of the one or more consumable parts.

Some of the parts in the chamber 214 may be impacted when etching, cleaning, or other operations that use harsh chemicals, are performed in the chamber. Alternately, some of the processes performed in the chamber may be impacted when mismatched parts are used inside the chamber or when the parts are left within the chamber far beyond their lifetime. In order to minimize the impact on the parts/process, authentic parts have to be used in the chamber and these parts have to be replaced or repaired or refurbished after certain number of process cycles (i.e., number of hours of operations) so that the integrity of the process operations in the chamber can be maintained. The attributes identified for each consumable part from the information obtained from the respective part's RF tags, may be used to perform audit, identify chamber matching features and use it to determine any chamber-part mismatch, optimize parts inventory, determine repair/refurbishment attributes of the part, determine lifetime left, identify different process modules in which the consumable part can be used, etc. The attributes of the consumable part can thus be used to assist in optimizing usage of the consumable part and determine when to discard or replace or remove or transfer the consumable part.

Some of the consumable parts that may be beneficial to track may include, an edge ring 206, shadow ring, focus ring, back shadow ring, plasma confinement structure, such as confinement rings (not shown), C-shroud, etc., chamber wall cover, showerhead 210. The aforementioned list of consumable parts is not exhaustive, and additional parts included in chamber 120a or other chambers (e.g., 120b-120d) may also be consumable and may need to be tracked and effectively managed. Embodiments presented herein are described with reference to tracking an edge ring 206, but the principles presented may be utilized to track any other consumable part included within the chambers 120a-120d.

The RF source 224 that provides power to the wafer support module 204, can include multiple RF power sources or a single RF power source capable of producing multiple frequencies of the RF signals. In one example, frequencies of the RF signals to generate the RF plasma may be between about 2 MHz and about 60 MHz. In another example, the frequencies of the RF signals to generate the RF plasma may be between about 100 kHz and about 100 MHz. In one example, the RF signals can have an RF power of between about 50 w and about 10 Kw. In another example, the RF signals can have RF power of between about 100 w and about 1500 w. The RF power source 124 can produce pulsed or non-pulsed RF signals.

A pump 226 is coupled to the chamber 214 to pump the process gas(es) and/or by-products released during fabrication operations, out of the chamber 214. The pump 226 is coupled to the controller to control the functioning of the pump 226.

The controller 222 includes a processor, memory, integrated circuits, software logic, hardware logic, input and output subsystems for receiving instructions, issuing signals/instructions, controlling operations, such as etching, cleaning, etc., enabling endpoint measurements, communicating with various components of the chamber 214, monitoring and overall controlling the various aspects of the different operations carried out within the chamber 214 of the process module 120a. The controller may be part of substrate processing system, such as cluster tool 100, and may be coupled to each module within the cluster tool 100 in order to individually communicate with, monitor and control the various aspects of process operations carried out within the respective modules of the cluster tool 100. The controller 222 includes one or more recipes including multiple set points for various operating parameters (e.g., voltage, current, frequency, pressure, flow rate, power, temperature, etc.) for the different processes performed within the different process modules of the cluster tool 100. The controller, depending on the processing requirements and/or the type of system, may be programmed to control various process operations, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a process module and other transfer modules and/or load locks connected to or interfaced with a specific system modules.

In addition to controlling the operating parameters of the different processes, the controller 222, in one embodiment, is configured to track the various consumable parts used in the one or more process modules within the cluster tool 100. The controller is configured to control positional and operation of the transfer arm by providing appropriate signal to the reader control 232, for example, so as to enable one or more RF readers 243 attached to the end of the transfer arm to access, activate and read the RF tags embedded in the various consumable parts. The data collected from the various tags provide identification information of the consumable parts, which is transmitted to the controller to determine the attributes of the consumable part. The attributes of the consumable part may be used to optimize usage of the consumable parts within the cluster tool 100 and optimize process(es) conducted within the different modules of the cluster tool 100.

The integrated circuits of the controller 222 may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some implementations, be part of a recipe defined by process engineers to accomplish one or more processing steps including forming layers, removing layers, depositing materials, such as metals, oxides, silicon, silicon dioxide, etc., on surface of the wafers, during the fabrication of one or more circuits, and/or dies on the wafer.

The controller, in some implementations, may be a part of or coupled to a computer that is integrated with or otherwise networked to the system. For example, the controller may be in the "cloud" or all or a part of a fab host computer system, which can allow for remote access and control of the processing operations of a cluster tool (i.e., substrate processing system) for defining circuits on the wafer. The computer may enable remote access to the system to monitor progress of current fabrication operations, examine a history of past fabrication operations, examine trends or performance metrics from a plurality of fabrication operations, to change parameters of current processing, to set processing steps to follow a current fabrication operations, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more process operations. It should be understood that the parameters may be specific to the type of process to be performed and the type of cluster tool or process module(s) that the controller is configured to interface with or control. The controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process in the chamber.

Depending on the type of process operations performed within a substrate processing system, example systems may include, without limitation, a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor devices.

As noted above, depending on the process step or steps to be performed by the tool, the controller might communicate with one or more of other tool circuits or modules, other tool components, cluster tools, other tool interfaces, adjacent tools, neighboring tools, tools located throughout a fabrication facility, tools within a factory, a main computer, another controller, or tools used in material transport that bring containers of wafers to and from tool locations and/or load ports in a semiconductor manufacturing facility.

Figure 2B:
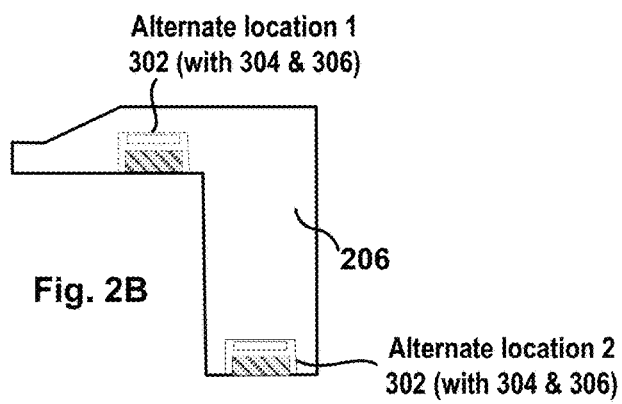
FIG. 2B illustrates an expanded view of a consumable part having one or more embedded RF tags, in accordance to one implementation.

FIG. 2B illustrates an expanded view of a consumable part, such as an edge ring 206 used in the chamber 214, having an embedded RF tag for tracking. The edge ring 206 may have a distinct ring profile on the top and the bottom surfaces with a step down defined along an inner radius and an elongated sidewall along the outer radius, so that the height of the edge ring along the inner radius is smaller than a height of the edge ring along the outer radius. An alternate implementation of an edge ring is shown in FIGS. 4A-4D, wherein the edge ring has a distinct ring profile along the top surface with a step down along an inner radius, and a flat surface profile along the bottom surface. In this alternate implementation, the height of the edge ring along the inner radius is smaller than the height along the outer radius. In other implementations, the edge ring may have a flat surface profile along both the top and the bottom surfaces. The edge ring includes an RF tag embedded within a pocket defined on a surface that is facing away from the process region 220 of the chamber 214. For example, the RF tag may be embedded on the surface that is maintained in vacuum (i.e., location 1 in FIG. 2B) or on the underside surface of the edge ring that is facing away from the process region 220 (i.e., location 2 in FIG. 2B).

Alternate implementations of the process chamber may also be visualized. For example, the chamber 214 may include a plasma confinement structure to confine the generated plasma within the plasma processing region 221 of the chamber 214. The confinement structure may be in the form of a set of confinement rings or a C-shroud, for example.

Referring back to FIG. 2A, a probe 242 with a reader 243 attached or embedded in it can be introduced into the chamber 214 via a transfer arm 208. The probe 242 may be introduced via the access window 236 defined on the side of the chamber 214. The access window 236, in one implementation, may be the same opening that is used to transfer a wafer into or out of the chamber 214. Alternately, a view port that is separate from the access window may be used to provide a separate access for the probe into the chamber 214. During introduction of the probe 242, the lower electrode (i.e., pedestal or ESC 204) may be moved down to allow the probe with the reader to move along a horizontal axis into the chamber 214 and power the passive RF tag disposed within a consumable part and to read the identification information from the RF tag.

The transfer arm 208 is configured to be moved in different directions within the chamber 214 to allow the probe 242 to reach different sections of the chamber 214 and to enable the RF reader 243 to detect and read RF tags 304 embedded in the different consumable parts within the chamber 214. In some implementations, the transfer arm 208 may include one or more joints 208a that are configured to allow a portion of the transfer arm 208 with the probe 242 to be rotated along a vertical axis or extended along a horizontal axis, or rotated radially. The one or more joints 208a provided on the transfer arm 208 provide the probe 242 with sufficient freedom of movement within the chamber 214 to allow the RF reader 243 to seek and activate the different RF tags 304 included in the different consumable parts. The transfer arm 208 is coupled to a reader control 232 to control the movement of the probe sensor. The reader control 232 is, in turn, coupled to the controller 222 which provides the appropriate signal to move the transfer arm into or out of the chamber 214 as well as to move the probe 242 inside the processing region 220 of the chamber 214.

FIGS. 3A and 3B illustrate the traversal path and the alignment of the RF reader with the RF tag embedded in a consumable part, such as an edge ring 206, when the RF reader is introduced on a transfer arm or an end-effector into a process module 120a. In the implementations in which an end-effector 144 is used, one or more RF readers 243 are embedded on the top and/or undersurface along the body of the end-effector 144. Alternately, the one or more RF reader 243 may be disposed on the fingers (either in the body or tip of the fingers) of the end-effector 144, or any other location of the end-effector 144. In an alternate implementation, one or more RF readers 243 may be disposed on a surface of a reader ring 242. The reader ring 242 may be similar in design to an edge ring and the RF readers 243 may be disposed along a circumference of the reader ring 242 on a top surface and/or on an undersurface of the reader ring 242 and introduced into the process chamber. In yet another implementation, the RF readers may be disposed on a top and/or underside surface of a wafer-like disc and introduced into the process chamber on the end-effector 144. The RF reader may also be embedded within a probe and introduced into the process chamber via a transfer arm.

FIG. 3A illustrates an embodiment of an end-effector 144 with a RF reader 243 embedded on a finger of the end-effector 144. The end-effector 144 is controlled to move along a traversal path 247 defined along a horizontal axis so that the RF reader 243 traverses along the reader path 249 that is parallel to the traversal path 247, as the end-effector is introduced into the chamber 120a through the access window 236. The reader path 249 aligns the RF reader embedded on the finger of the end-effector, with the RF tag embedded in the edge ring. In some implementation, the consumable part may be held in place within the process chamber (e.g., on the pedestal or ESC) using one or more alignment pins 351, so that the location of the RF tag and the alignment of the RF reader 243 can be reliably defined.

FIG. 3B illustrates a view of the RF reader-RF tag alignment within the process chamber along a vertical axis B-B shown in FIG. 3A, as the end-effector moves along the traversal path 247 and the RF reader moves along the reader path 249. Only a portion of the edge ring 206 in which the RF tag is embedded is shown within a portion of the process module 120a in order to highlight the alignment, whereas in reality the remaining components of the process module are also present.

As the RF reader 243 is introduced into the process module 120a along the reader path 249, the RF reader 243 (embedded directly on the end-effector 144 or embedded in the reader ring that is supported on the end-effector 144) aligned above the RF tag 304 embedded within the consumable part 206, is configured to activate the RF tag 304, read the tag identification and store the tag identification in a local memory. The tag identification information is then forwarded to the controller 222. The controller 222 uses the RF tag identification information to track the consumable part within the process chamber, as the consumable part is moved from one process chamber to another process chamber within the process tool, and when the consumable part is removed from the process tool and re-introduced into the process tool at a later time. Details of providing the RF readers 243 on a transfer arm or end-effector will be discussed with reference to FIGS. 7A-7B.

The frequency at which the RF tag 304 is operated is greater than the operating frequency used to generate plasma within a chamber 214. This ensures that the RF tag 304 does not get activated prematurely during operation of the chamber 214 and hinder in the plasma etch process. In some implementation, the operating frequency for generating the plasma in the chamber 214 may be between about 100 kilo Hertz (kHz) and about 100 Mega Hertz (MHz). In some specific implementations, the operating frequency for generating the plasma may be between about 400 kHz and about 60 MHz. The RF tag 304 may be configured to operate at an ultra-high frequency, wherein the ultra-high frequency may be defined to be greater than the operating frequency of the chamber 214. In one implementation, the ultra-high frequency is defined to be between about 150 MHz and about 1 Giga Hertz (GHz).

The various implementations of this application that are described herein can be extended to include other non-metallic chamber parts, such as inner liner, ground rings, shadow rings, showerhead, ESC, etc. These consumable parts are generally made from quartz, silicon, carbide, silicon carbide, oxide ceramics, and/or other materials with similar chemical, physical and thermal properties that are conducive for process performed in the chamber.

FIGS. 4A-4D illustrate an example of how the RF tag 304 is integrated into a pocket 302 defined on an underside surface of a consumable part, such as an edge ring, in one implementation. The view shown in FIGS. 4A-4D is an upside-down, cross-sectional view of a portion of the edge ring to illustrate location of the pocket and placement of the RF tag in relation to the top and underside surfaces 206a, 206b of the edge ring. To begin with, a pocket 302 is created on the underside surface 206b—a side of the edge ring 206 that is facing away from the plasma processing region of a chamber. The edge ring 206 has a ring profile wherein a height 'd1' along the inner radius is less than a height 'd2' along the outer radius of the consumable part. The pocket 302 may also be created along an inner diameter of the consumable part that is maintained in vacuum (e.g., a side shown in FIG. 2B) or in a shadow space that is shielded from the RF plasma. When the consumable part is an inner liner, the pocket may be defined on the outer surface of the sidewall of the inner liner that is facing away from the processing region.

FIG. 4B illustrates a view of the pocket 302 in which an RF tag 304 is placed. The depth 'd3' of the pocket is defined such that there is sufficient space to embed the RF tag and leave an amount of the consumable part on the top surface that is greater than a wear of the consumable part during the part's lifetime. For example, in the case of an edge ring, the depth of the pocket 'd3' is defined such that a depth of the consumable part from the bottom of the pocket to the top surface 206a of the consumable part 206 (i.e., difference d2−d3) is greater than an amount of wear experienced by the consumable part during the consumable part's lifetime. This is to ensure that the RF tag 304 does not get damaged during chamber use.

The RF tag 304 may be adhered to the bottom surface of the pocket 302 using an adhesive 313. The adhesive 313 used for securing the RF tag 304 to the pocket 302 bottom may be selected so as to withstand the process conditions within the process chamber.

A top surface 206a of the edge ring 206 has a ring profile that includes a step down along an inner radius. It should be noted that the ring profile of the consumable part 206 is different from the ring profile illustrated in FIGS. 2A and 2B. The pocket 302 is defined in the portion that has the greater height (i.e., the portion that is at height d2).

FIG. 4C illustrates a plug 306 being placed to cover the opening of the pocket 302 and to seal the opening. The plug is placed over the RF tag 304 received in the pocket 302 and is laser fused with a laser welder using material from the plug and the pocket so as to provide an air-tight seal of the pocket 302. The plug 306 may be made of the same material as the consumable part 206 or may be made of different material that exhibits similar chemical, thermal and physical properties as the remaining portion of the consumable part 206. The height of the plug 306 is defined to ensure that there is sufficient space left above the RF tag 304 within the pocket. For example, the height 'd4' of the plug 306 is defined to be less than the difference between the height of the pocket d3 and the height 'd5' of the RF tag 304 (i.e., d4<(d3−d5), so that there is sufficient space between the top surface of the RF tag 304 and the bottom surface of the plug 306. The opening is substantially sealed to ensure that the pocket in which the RF tag is received is maintained in vacuum so that the RF tag 304 does not get compromised from RF radicals.

In one implementation, the plug 306 is sealed by laser fusion using a pulsed laser welder 307. Details of sealing the opening will be discussed in greater detail with reference to FIGS. 5A-5B. The welding does not have to be pulsed laser welding but can be any other type of welding. In another implementation, the opening of the pocket 302 is sealed via compression fit using the plug 306. The sealing is done to ensure that there are no leaks—either air leaks or RF leaks. Even with compression fit, there is a likelihood of having RF leak wherein RF radical may find their way into the pocket where the RF tag is embedded. For instance, when the pocket has edges or corners, the compression fit may not perfectly seal the opening. As a result, RF radicals may find their way into the pocket and can create arcing issue. In order to prevent such leak, the compression fit may be augmented with an adhesive bond to further seal the plug into place. The adhesive bond used for sealing the opening is selected so as to fairly withstand the harsh effects of the RF plasma, for at least the lifetime of the consumable part. For instance, if an edge ring (i.e., consumable part) has a lifetime of 2000 hours, an adhesive may be selected such that it has the ability to withstand the RF plasma for at least 2200 hours. The number of hours is just given as an example to illustrate the point that the adhesive that is selected has to be sufficiently strong to withstand the effects of the RF plasma for at least the lifetime of the consumable part. In one implementation, the adhesive that is used for sealing the plug into the opening and the adhesive used to adhere the RF tag to the bottom of the pocket, is epoxy-based. In other implementations, any other adhesive may be used to seal the opening and/or adhere the RF tag to the pocket, and the adhesive is selected so as to be able to withstand the RF plasma effect. In alternate implementations, the opening of the pocket is sealed using a threaded plug in order to provide an air-tight seal. In another implementation, the opening of the pocket is sealed by using adhesive bonding along the length of the interface, wherein the adhesive used for bonding may be epoxy-based. The adhesives for sealing the opening and/or securing the RF tag in the pocket is not restricted to epoxy-based adhesive but can use any other type of adhesive that is capable of providing similar functionality as epoxy-based adhesive.

The pocket 302 for placing the RF tag 304 may be formed not only on the underside but may also be formed on an inside diameter of the consumable part that is in vacuum or in a shadow space that is protected both from the direct and indirect influence of RF plasma (as illustrated in FIGS. 2A & 2B). In some implementations where the consumable part is an electrostatic chuck that includes a cooling component, the pocket may be defined deep in the ESC and proximate to the cooling component, so that the weld location is far from the RF tag and the top surface of the ESC, thereby preserving the integrity of the RF tag. The RF tag is selected such that the RF tag is able to withstand the temperature within the chamber.

FIG. 4D illustrates a view of the underside surface 206b of the consumable part 206 after the plug 306 has been placed to seal the opening and the surface around the pocket has been polished. After placing the plug 306 and sealing the opening, the top surface of the opening and portion of the top surface of the consumable part 206 that is adjacent to the opening are polished to match with a surface profile of the rest of the surface of the consumable part. The result of the polishing is the consumable part with a fully integrated RF tag. The RF tag enables the consumable part to be easily tracked and is tamper-proof and damage-proof, at least for the life of the consumable part.

FIGS. 5A-5B illustrate an example of employing a pulsed laser welder to laser fuse a plug in the opening of the pocket defined on a surface of a consumable part, such as an edge ring, in one implementation. The pocket 302 is defined at a certain depth on the underside surface 206b of the edge ring 206. The pocket is created by removing a portion of the consumable part. In one implementation, the pocket is defined by drilling and removing a portion of the consumable part. In some implementation, precision machining may be employed for drilling the pocket. The portion of the consumable part that is removed may be used for defining a plug 306 to cover the opening defined in the pocket 302. In this implementation, the height of the plug 306 that was removed to define the pocket, may be adjusted so as to include sufficient space between the top surface of the RF tag 302 and the bottom surface of the plug 306 covering the pocket. In other implementations, a different material may be used to plug the opening, wherein the different material may have same or substantially same refractive index as that of the consumable part. In another implementation, the pocket may be created using a mold or three-dimensional (3D) printing. In this implementation, the plug may be defined separately using same material or substantially same material as the consumable part. In some implementations, using substantially same material includes using material that have similar chemical, physical and thermal properties as the material used for the consumable part. The depth of the pocket 302 is defined to ensure that amount of material left on the top surface is greater than a wear experienced during lifetime of the consumable part and there is sufficient space to embed the RF tag. The pocket 302 is defined by sidewalls 310 and a bottom surface 312. The length of the sidewalls 310 of the pocket 302 is defined to be greater than a height of the plug 306 but smaller than a height d2 of the consumable part along the outer diameter.

The RF tag 304 is received at the bottom 312 of the pocket 302. In some implementation, the RF tag 304 may be glued in place within the pocket using an adhesive. The opening of the pocket 302 is sealed using a plug 306. A length of the sidewalls of the plug is defined, such that there is sufficient room between a top surface of the RF tag 304 received in the pocket 302 and a bottom surface of the plug 306. The plug received in the opening defines a plug-pocket interface 315 that runs the length of the sidewall of the plug 306. In some implementation, the consumable part (e.g., edge ring) and the plug used to seal the opening of the pocket 302 are made of semi-opaque material. The plug may be made of the same material as the consumable part or may be made of a different semi-opaque material. The use of semi-opaque material for the consumable part 206 and the plug 306 provides a line-of-sight for the depth of the plug-pocket interface 315. Further, the material used for the consumable part has a defined refractive index, and if the plug 306 is made of the same material as the consumable part, then the plug 306 will have the same refractive index. In this case, however, the plug-pocket interface will have a different refractive index than the consumable part 206 and the plug 306. In an alternate implementation, the plug 306 may be made of a material that is different from the material of the consumable part. The material for the plug may be selected to have substantially same refractive index as the material used for the consumable part.

A laser welder 307 can be tuned to detect the refractive index of the plug-pocket interface 315 so that a laser generated by the laser welder 307 can be directed to perform laser fusion and weld along the plug-pocket interface 315. This is more advantageous than merely welding surface because surface welding may not last long as they do not have sufficient depth. The surface welding can easily get damaged by the RF radicals that make their way to the underside surface of the edge ring 206. Thus, in order to ensure that the seal lasts the lifetime of the edge ring, the welding is done along the length of the plug-pocket interface 315. The tuned laser can weld the length of the plug-pocket interface 315 so long as the laser has line-of-sight. The line-of-sight may be at an angle from the plug-pocket interface, as shown in FIG. 5B. The semi-opaque characteristic of the material used in the plug and the consumable part, and the tuning of the laser allows the laser to detect the plug-pocket interface 315 and weld the sidewalls of the plug 306 to the sidewalls 310 of the pocket 302 for the length of the plug-pocket interface 315. The line-of-sight angle may be anywhere between 0° and 90°. Another advantage of using the pulsed laser welding is that with the pulsed laser the welding location where the heat from the laser is applied can be controlled to a specific area (i.e., portion of the sidewalls), so as to provide sufficient focused heat to weld the sidewalls without heating the entire edge ring. Further, the pocket is sufficiently deep so that the RF tag is far from the weld location of the plug-pocket interface to prevent damage to the RF tag during welding. It should be noted that pulsed laser welding is one form of welding that can be used and that other types of welding can also be employed to weld the plug 306 to the sidewalls of the pocket 302.

FIG. 5B illustrates how the laser from the pulsed laser welder 307 is used to weld 317 the length of the plug-pocket interface 315. The welding is done by first tuning the laser to detect the plug-pocket interface 315 and then direct the tuned laser to weld the sidewall of the plug to the sidewall 310 of the pocket 302. The top surface of the plug is aligned with the top surface of the pocket and the laser is positioned to move along the plug-pocket interface 315 to laser weld (or simply referred henceforth as "weld") 317 the interface between the sidewalls of the pocket and the plug together. The laser can be directed at an angle. The tuning allows the laser to detect the interface below the surface of the plug by identifying the difference in the refractive index of the plug-pocket interface 315 while masking the top surface of the pocket. With the laser welding 317 done along the plug-pocket interface 315, there is no need for welding the top surface of the pocket 302. However, in some implementations, the top surface of the pocket may also be welded. The welding along the length of the plug-pocket interface 315 ensures that the opening is sealed tightly (i.e., air-tight seal) to provide sufficient insulation to the inside of the pocket to prevent RF leakage of the RF radicals into the pocket. The welding of the interface lasts for a longer period of time than the surface weld. This type of sealing the plug ensures that the RF tag is protected not only against the process performed within the chamber but also when the edge ring is moved out of the chamber for cleaning, refurbishment, handling, or other post-process operation. For more details about the pulsed laser welding, reference can be made to the following article titled, "Ultrafast Pulsed Lasers Weld Ceramics Without a Furnace", published in SciTechDaily on Aug. 26, 2019, by University of California Riverside and University of California San Diego.

FIG. 6 illustrates the effect of the wear of the top surface of a consumable part, such as an edge ring, on the strength of the RF signal generated by the RF tag 304. An RF reader 243 is introduced into the chamber to activate the RF tag embedded within a consumable part. The activated RF tag emits RF signals, which are then read by the RF reader 243. The strength of the RF signal emitted from the RF tag varies based on the amount of consumable part that is on top of the pocket 302. As the consumable part wears out due to exposure to the plasma in the processing region of the chamber, the RF signal strength increases. The strength of the RF signal can be captured by the RF reader along with the identification information and transmitted to the controller 222. The controller 222 can use the information provided by the RF reader 243 to first identify the consumable part, and to determine attributes of the consumable part. Further, the signal strength may be used to determine cross-sectional depth of the consumable part, which can then be used to determine amount of wear that has occurred, amount of life left for the consumable part, approximate surface profile due to wear, etc.

The amount of wear can vary due to non-uniform erosion of the surface of a consumable part—especially in a non-metallic consumable part made of quartz, silicon, etc. In such cases, the amount of wear can be approximately determined through calibration by first determining strength of the RF signal emitted by the RF tag for an unused consumable part and then comparing unused part's signal strength to the signal strength collected over the lifetime of the consumable part. The amount of wear endured by the entire consumable part can be approximately determined using the signal strength from a tightly controlled high tolerance surface defined over the RF tag. Care may need to be taken to ensure that the angle at which the signal strength is measured remains consistent for the lifetime of the consumable part. This can be done by placing an RF reader on a scope and introducing the scope via a transfer arm into the chamber so that the scope is at a particular height and positioned at a particular angle to read the RF signal from the RF tag. Details of the placement of the RF reader on different reading surfaces will be described with reference to FIGS. 7A-7B. The identification information and other attributes of the consumable can be used to perform various part audits, such as determining if the chamber is using authentic parts, determining any chamber to consumable part mismatch, lifetime left in the consumable part, number of repairs/refurbishments performed on the consumable part, performing part usage optimization, amount of wear on the consumable part, managing part inventory, etc. When it is determined that a chamber is using an un-authentic part, an alert may be issued to indicate the same.

Figure 7A:
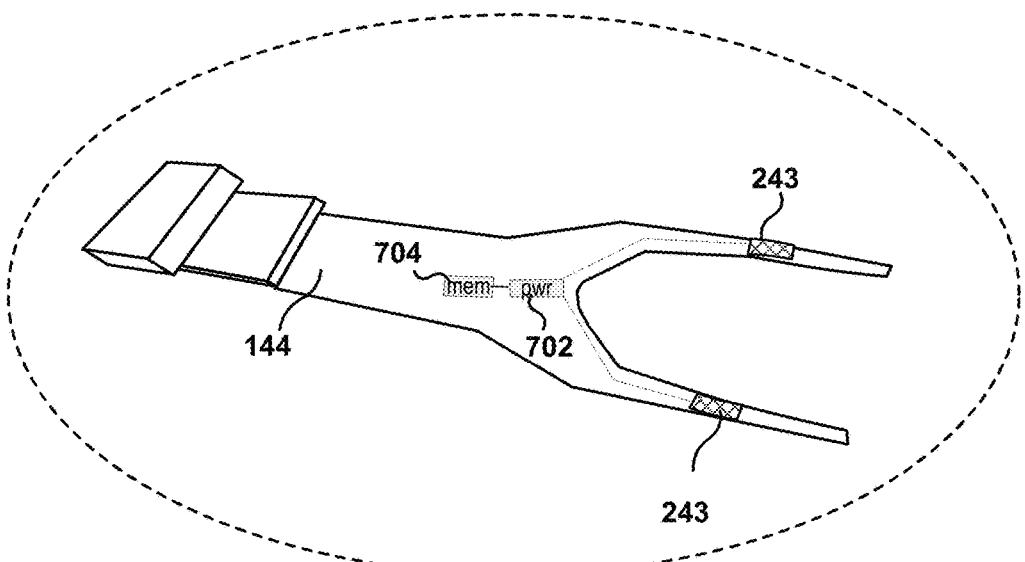
FIG. 7A illustrates an end-effector of a robot arm on which one or more RF readers can be disposed to read the RF tag, in accordance with one implementation.
Figure 7B:
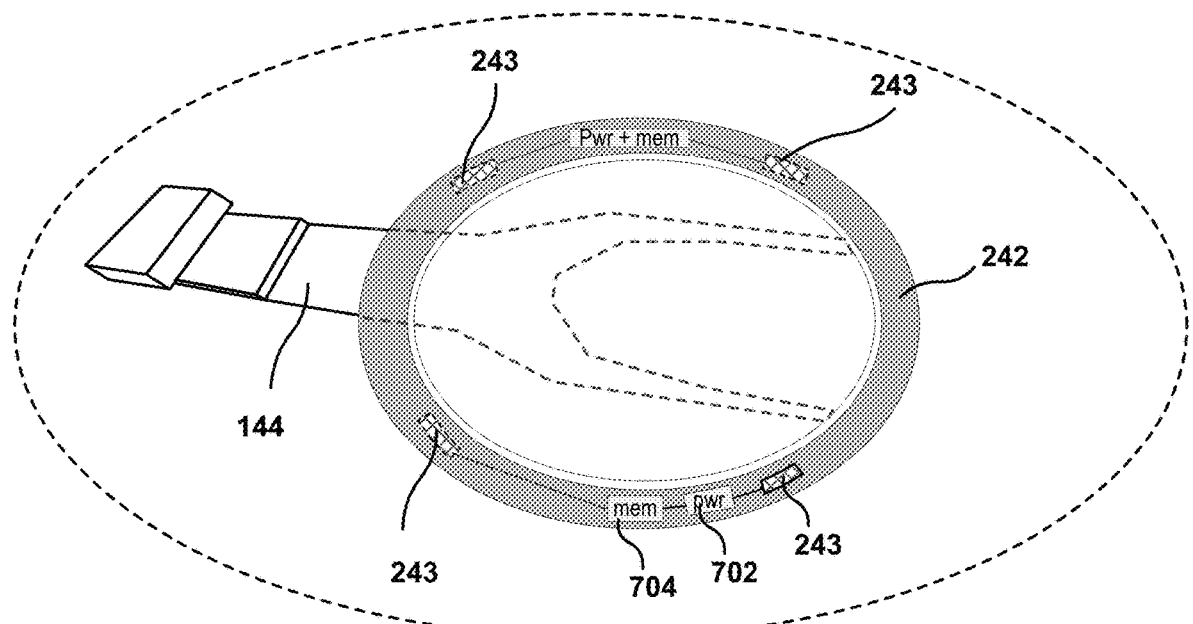
FIG. 7B illustrates a reader ring on which one or more RF readers are disposed, wherein the reader ring is being introduced into a process module via an end-effector of a robot arm, in accordance with one implementation.

FIGS. 7A-7B illustrate various surfaces on which RF readers may be disposed for reading the information from the RF tag, in some example implementations. FIG. 7A illustrates one example implementation wherein the RF reader is placed on an end-effector 144 that is disposed on a robot arm used in a process tool/process chamber and introduced into the chamber through an opening of the chamber. The RF reader 243 may be placed on one finger or both fingers of the end-effector. The RF reader 243 is coupled to a power 702 that provides power to the RF reader 243 to activate the RF tag 304, and to a memory 704 to store the RF tag information. The robot is coupled to a controller 222 directly or via a reader control 232, so as to communicate the RF tag information to the controller 222. The opening used to introduce the end-effector 144 with the RF reader may be the same opening used for moving the wafer into and out of the chamber or may be a different opening, such as an access window or a gate valve defined on the sidewall of the chamber. The end-effector 144 that includes the RF reader may be the same end-effector that is used to move the wafer into or out of the chamber or may be a different end-effector.

The RF readers may be provided on an underside surface of the end-effector 144 and/or on the top surface of the end-effector 144 and/or at a tip of one or more fingers of the end-effector 144 and/or on the inner or outer side of the fingers of the end-effector 144 or any other location on the end-effector 144. As the end-effector is introduced into the chamber along the traversal path, the one or more RF readers on the end-effector 144 traversing along the reader path activate the various RF tags located within one or more consumable parts and read the information provided through the RF signals generated by the activated RF tags. The information from the RF tag is stored in the memory 704 and shared with the controller 222. The controller 222 uses the tag and signal strength information to identify the RF tag and determine attributes of the associated consumable part.

FIG. 7B illustrates an alternate implementation in which a reader ring 242 is engaged to detect, activate and read RF tags disposed within the chamber. The design of the reader ring 242 may be similar to that of an edge ring 206 and one or more of the RF readers 243 may be disposed on the top surface and/or on the underside surface of the reader ring 242. The reader ring 242 may be balanced on the end-effector 144, wherein the fingers of the end-effector 144 are elongated and include a proximal end that is closer to arm support and a distal end defined at the tips of the elongated fingers. Contact pads may be provided on the end-effector 144 at the proximal end and at the distal end (i.e., tips of the elongated finger) so as to provide reliable support to the reader ring 242 received thereon. When the end-effector 144 with the reader ring 242 is introduced into the chamber, the one or more RF readers 243 on the reader ring 242 detect the RF tags 304 embedded in the consumable parts, and activate the RF tags 304 to read the identification information. The robot arm controls the movement of the end-effector 144 into the chamber and within the chamber to enable detection of all the RF tags.

In alternate implementation, a wafer-like device (not shown) with RF readers 243 disposed on the surface (either on the underside surface or top surface) may be used instead of the reader ring 242 illustrated in FIG. 7B. In such implementation, the end-effector 144 may be used to balance and move the wafer-like device in a manner similar to the reader ring 242 or the wafer.

In the implementations that use the reader ring 242 or the wafer-like device, the existing end-effector that is used for transferring the wafer, may be used for moving the reader ring 242 or the wafer-like device into the chamber, without need for any modification. The end-effector is configured to hold the reader ring 242 or the wafer-like device at a pre-defined height from the surface of the lower electrode so that the RF reader 243 aligns with the RF tags in the consumable part. In alternate implementations where the RF readers 243 are disposed on a probe, the probe may be moved in different directions to detect, activate and read the RF tags disposed on the different consumable parts. Every time the end-effector is used to move RF tag needs to be read, the end-effector moves the reader ring 242 or the wafer-like device into the chamber and after the RF tags are read and information collected, the reader ring or the wafer-like device is moved out of the chamber. The wafer-like device or the reader ring may then be inserted into a second chamber to read the RF tags embedded in one or more consumable parts in the second chamber, and so on. In these implementations, the reader ring or the wafer-like device is not loaded on to the lower electrode but maintained at a height defined along the reader path for reading the information from the RF tags. In some implementations, the reader ring 242 or the wafer-like structure is stored in a buffer within a ring station that is coupled to the process tool, and the end effector from the robot of the ATM and/or the VTM is configured to retrieve the reader ring from the ring station and move the reader ring into one or more process modules of the process tool. In another implementation, the reader ring or the wafer-like device could be stored in a slot within an aligner or in the airlock (i.e., transfer module). The RF reader used to activate the RF tags may be battery operated.

In yet other implementation, the RF readers may be disposed directly on the end-effector. In this implementation, every time the end-effector is used to move a wafer into or out of the process chamber, the RF reader may be used to activate and track the consumable part within the process chamber. As no process operation is occurring when the wafer is being moved into or out of the process chamber, the activation of the RF tag and reading information from the RF tag will not hinder the process operations. Alternately, the RF readers may be disposed on a prove and moved into and out of the process chamber through a transfer arm 208 that is coupled to the reader control 232. The transfer arm 208 is configured to be moved along a horizontal axis and/or rotated along a vertical axis within the chamber to allow the RF reader 243 embedded thereon to be able to reach different sections of the chamber to detect and read RF tags 304 embedded in the consumable parts. One or more joints provided on the transfer arm may provide sufficient freedom of movement within the chamber to allow the RF reader 243 disposed on the probe 242 to access different sections of the chamber.

Figure 8A:
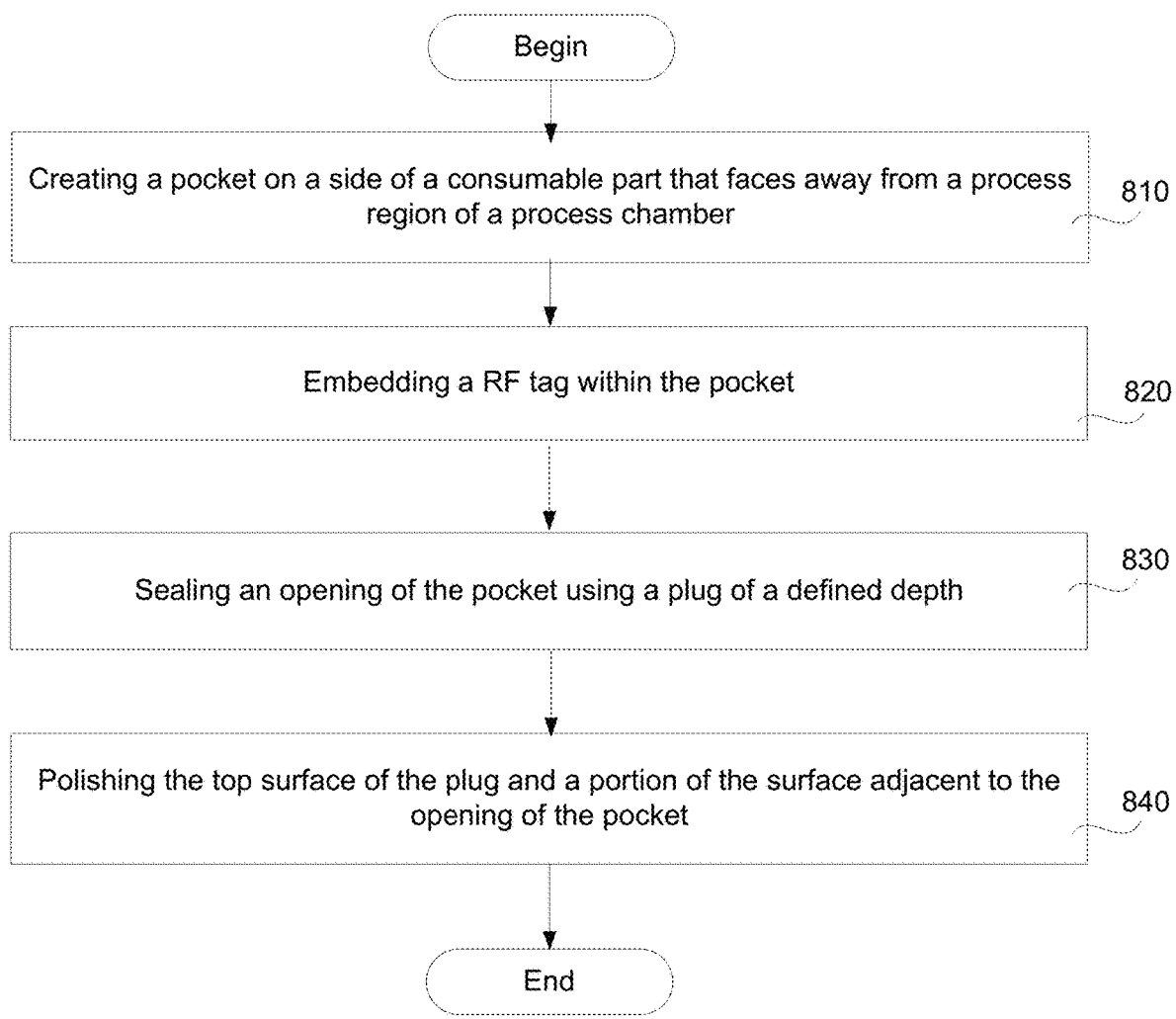
FIG. 8A is a flowchart of a method for manufacturing a trackable consumable part with an embedded RF tag for use in a semiconductor process apparatus, in accordance with one implementation.

FIG. 8A is a flowchart of a method for manufacturing a consumable part that can be used within a semiconductor processing tool, according to one embodiment. The consumable part is trackable using a radio frequency tag embedded therein. While the various operations in this flowchart are presented and described sequentially, one of ordinary skill will appreciate that some or all of the operations may be executed in a different order, be combined or omitted, or be executed in parallel.

The method begins at operation 810, wherein a pocket is created (i.e., defined) on a side of a consumable part that faces away from a process region of a chamber. The consumable part may be an edge ring that is configured to surround a wafer, when the wafer is received on a pedestal or electrostatic chuck disposed within the chamber for processing. In the case of the edge ring, the side that faces away from the process region is an underside surface, as the top surface adjacent to the wafer gets exposed to the harsh chemistries of the plasma chamber. The pocket defined on the underside surface is of a defined height and is defined in a portion of the edge ring that has greatest depth. The edge ring may include a ring profile that includes a step defined along an inner radius. Consequently, the pocket is defined in the portion that has the greatest depth and the height of the pocket is defined to be less than the greatest depth. Since the pocket is defined on the underside (i.e., bottom side) of the edge ring, the height of the pocket is defined to ensure that there is sufficient edge ring surface between the bottom of the pocket and the top surface of the edge ring. The pocket is defined such that the amount of edge ring surface left from the bottom of the pocket to the top surface of the edge ring is greater than the amount of wear experienced on the top surface of the consumable part during the lifetime of the edge ring. This ensures that the RF tag that is embedded in the pocket does not get damaged during the lifetime of the edge ring. The depth of the pocket ensures that the RF tag is sufficiently insulated from the harsh environment of the chamber from both the sides of the edge ring.

A radio frequency (RF) tag is embedded within the pocket, as illustrated in operation 820. The RF tag, in one implementation, may be adhered to the bottom surface of the pocket using an adhesive that is capable of withstanding the environment of the chamber.

An opening of the pocket is sealed using a plug of a defined depth, as illustrated in operation 830. The depth of the plug is defined to be smaller than the depth of the pocket but is defined to have sufficient depth along a plug-pocket interface defined along the sidewalls of the plug and the pocket so as to properly insulate the RF tag. In one implementation, the plug is made of the same material as the edge ring. For example, the plug may be part of the edge ring that was removed when the edge ring was drilled to form the pocket. When a precision machining is used to form the pocket, the portion of the edge ring that is removed will have precise surface attributes and dimensions to cover and seal the opening of the pocket. In this example, the depth of the plug may be adjusted so as to provide sufficient space in the pocket to accommodate the RF tag. In alternate implementation, the plug is made of a different material that has similar physical, chemical and thermal properties as the edge ring. In one implementation, the plug is made of a material that has same or substantially same refractive index as the material used in the consumable part. The depth of the plug is smaller than the difference in the depth of the pocket and the depth of the RF tag. Referring to the depth dimensions shown in FIGS. 4A-4C, the depth 'd4' of the plug 306 is less than (d3−d5), wherein 'd3' is the depth of the pocket 302 and 'd5' is the height of the RF tag 304. In some implementations, the edge ring and the plug may be made of a semi-opaque material to provide line of sight to the depth of the plug.

The opening of the pocket is sealed along a plug-pocket interface defined between the sidewall of the pocket and the sidewall of the plug, such that the sealing is done for the depth of the plug. The sealing may be done via laser fusion using pulsed laser welding using a pulsed laser welder, for example, wherein the pulsed laser is tuned to provide a focused heat to select area without introducing excessive heat to the remainder of the edge ring that can potentially damage the RF tag. The focused heat is sufficient to fuse the two sidewalls along the plug-pocket interface to provide an air-tight seal. In some instances, the seal is vacuum-tight. Other forms of welding or bonding can also be used, including compression fitting, bonding with an adhesive, compression fitting augmented with adhesive bonding, as previously mentioned. The aforementioned forms are given as examples and should not be considered exhaustive and that other forms of welding/bonding can also be used.

After the plug-pocket interface has been sealed along the length of the plug, the top surface of the plug and a portion of the surface adjacent to the opening of the pocket are polished/grinded, as illustrated in operation 840. The polishing/grinding is done to ensure a seamless embedding of the RF tag into edge ring by matching the surface profile of the area around the plug and the opening with the surface profile of the remainder of the edge ring. The polishing/grinding can be performed using lapping or other surface finish methods to make the plug visually undetectable and the opening visually indistinguishable against the surrounding surfaces.

Figure 8B:
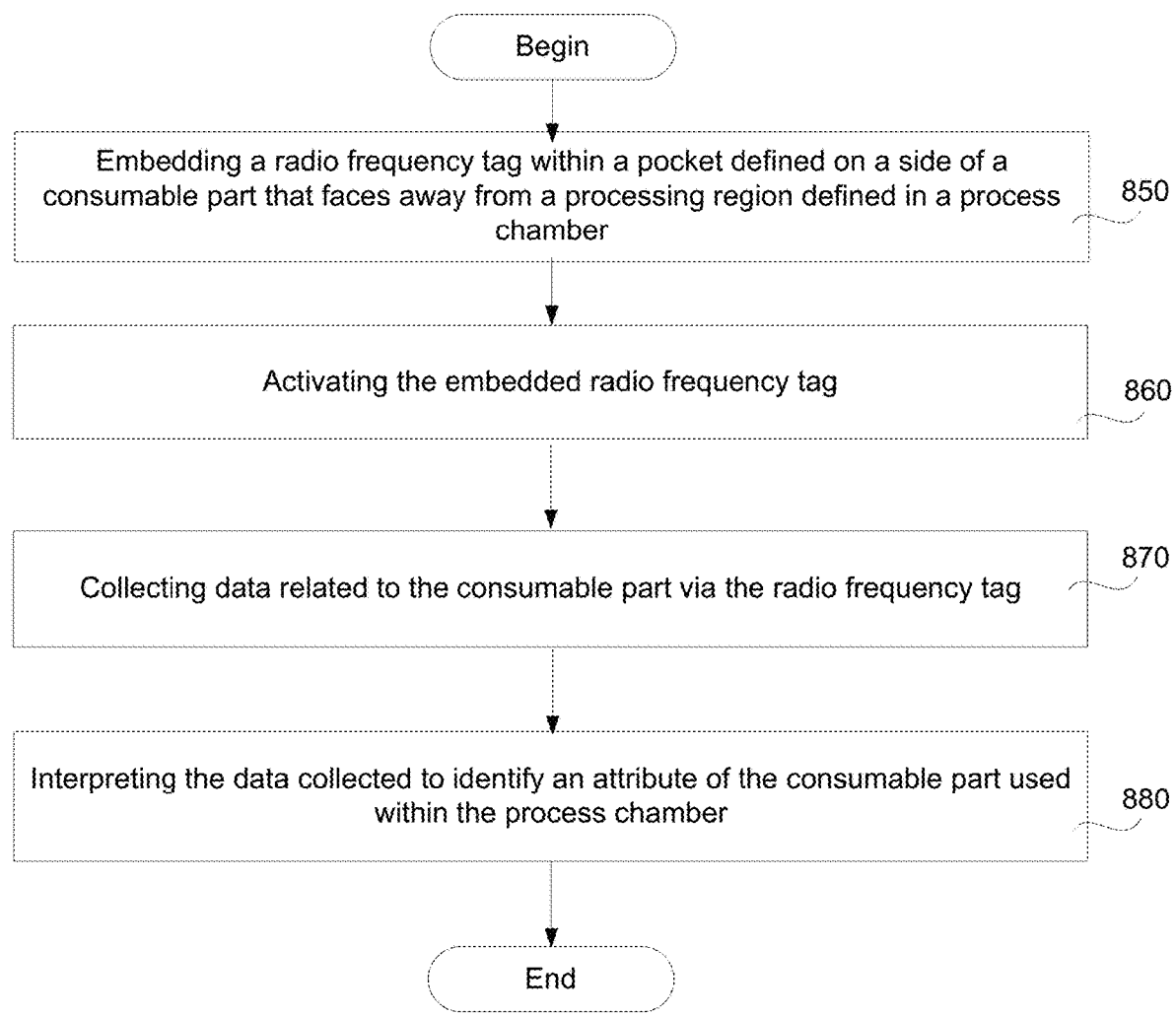
FIG. 8B is a flowchart of a method for tracking a consumable part with an embedded RF tag used in a semiconductor processing apparatus, in accordance with one implementation.

FIG. 8B is a flowchart of a method for tracking a consumable part that can be used within a semiconductor processing tool, according to one embodiment. The tracking is enabled via a radio frequency tag embedded therein.

The method begins at operation 850, wherein a radio frequency tag is embedded within a pocket defined on a side of a consumable part received within a process chamber. The consumable part, in one implementation, may be an edge ring that is received within the process chamber and is configured to surround a wafer, when the wafer is received on a substrate support region of the consumable part. The side where the radio frequency (RF) tag is embedded is a side that faces away from a processing region defined in the process chamber. In some implementation, the pocket may be defined on an underside surface of the consumable part. In an alternate implementation, the pocket may be defined on an outer side surface of the consumable part that is outside of the process region. The RF tag is a passive tag.

The RF tag embedded within the pocket of the consumable part is activated by a reader within the process chamber, as illustrated in operation 860. In some implementations, the reader is inserted into the process chamber. For instance, in one implementation, the reader may be defined on an underside surface of an end-effector of a robot and introduced into the process chamber when transporting a wafer for processing or when data from the RF tag needs to be collected. In alternate implementations, the reader may be included in a reader ring or on an underside surface of a wafer-like device that is supported on the end-effector of the robot and introduced into the process chamber. In these implementations, the robot is coupled to a controller that provides signals to control the movement of the robot into and out of the process chamber. The reader is coupled to a power source and the power from the power source is used to power the reader and to activate the RF tag.

Data related to the consumable part is collected by the reader via the activated RF tag, as illustrated in operation 870. In some implementations, the reader is a RF reader and includes or is coupled to memory. The memory in or coupled to the reader is used to store data collected by the reader.

The data collected by the reader is interpreted to identify attributes of the consumable part used in the process chamber, as illustrated in operation 880. In some implementations, the data collected by the reader is transmitted to a controller and the controller interprets the data to identify one or more attributes of the consumable part. The one or more attributes that may be identified from the collected data include identification information of the consumable part or usage data of the consumable part used in the process chamber, or a combination thereof. In some implementations, the information collected is used to determine an amount of usage life left for the consumable part before the consumable part needs to be replaced.

The various implementations discussed herein provide ways to track, in real-time, a consumable part in-situ. This method offers advantages over conventional methods of tracking that provided engraved identification numbers that could be easily damaged from continuous exposure to the harsh environment of the chamber or could be easily tampered. When these engraved identification numbers were provided on an underside to avoid exposure, the consumable part had to be removed from its position in the chamber in order to be read, which entailed opening the chamber, removing the part, reading and verifying the part, replacing the part, closing and conditioning the chamber. This resulted in significant downtime. Whereas the current embodiments provide ways to embed tags within the consumable part so that the information from the tags can be easily read while the tags are in-situ and insulated from the harsh environment within the chamber. According to some implementations, the tags are passive tags that are configured to be operated at ultra-high frequency (i.e., ultra-high frequency tags)—frequency that is sufficiently greater than a frequency used for generating plasma within the chamber, so that they do not resonate and send back signal when the chamber is operating, thereby avoiding interfering with any process(es) conducted at the operating frequency of the chamber. Whenever the tags need to be read, the process within the chamber can be stopped and a probe in which a RF reader is embedded can be introduced via a transfer arm. The RF reader powers the RF tag and reads the RF signal transmitted by the RF tag to determine the identification information. The identification information encoded in the RF tag is difficult to reproduce making it sufficiently tamper proof, and the air-tight seal of the pocket ensures that no RF radical enters the pocket and damages the RF tag. The information provided in the RF tag enables maintaining a digital thread for a consumable part by allowing easy tracking from the part's inception till death (i.e., when the part has run its life course and has to be discarded). The consumable part can be part of an interlock system, wherein the chamber needs specific parts in order to function and each chamber part communicates with a controller or computer to enable smooth function of the system.

In some implementations, the RF tag may be encapsulated within a ceramic shell. The RF tag is selected to operate at a high temperature. In some implementations, the temperature at which the RF tag works is between about 40° C. to about 150° C. In other implementations, the RF tag may be configured to operate at a much higher temperature (e.g., up to 400° C. or more) than the range provided above. In some implementations, the RF tag that is operating at a lower temperature (i.e., the range defined above) may be shielded by embedding the RF tag on the backside or a side that is facing away from the process environment of the chamber, where the temperature is significantly cooler. The pocket for placing the RF tag is sufficiently deep that the RF tag can barely feel the extreme temperature while sufficient amount of consumable part covers over the bottom surface of the RF tag. Other advantages can be visualized by one skilled in the art after reading the various implementations discussed herein.

Figure 9:
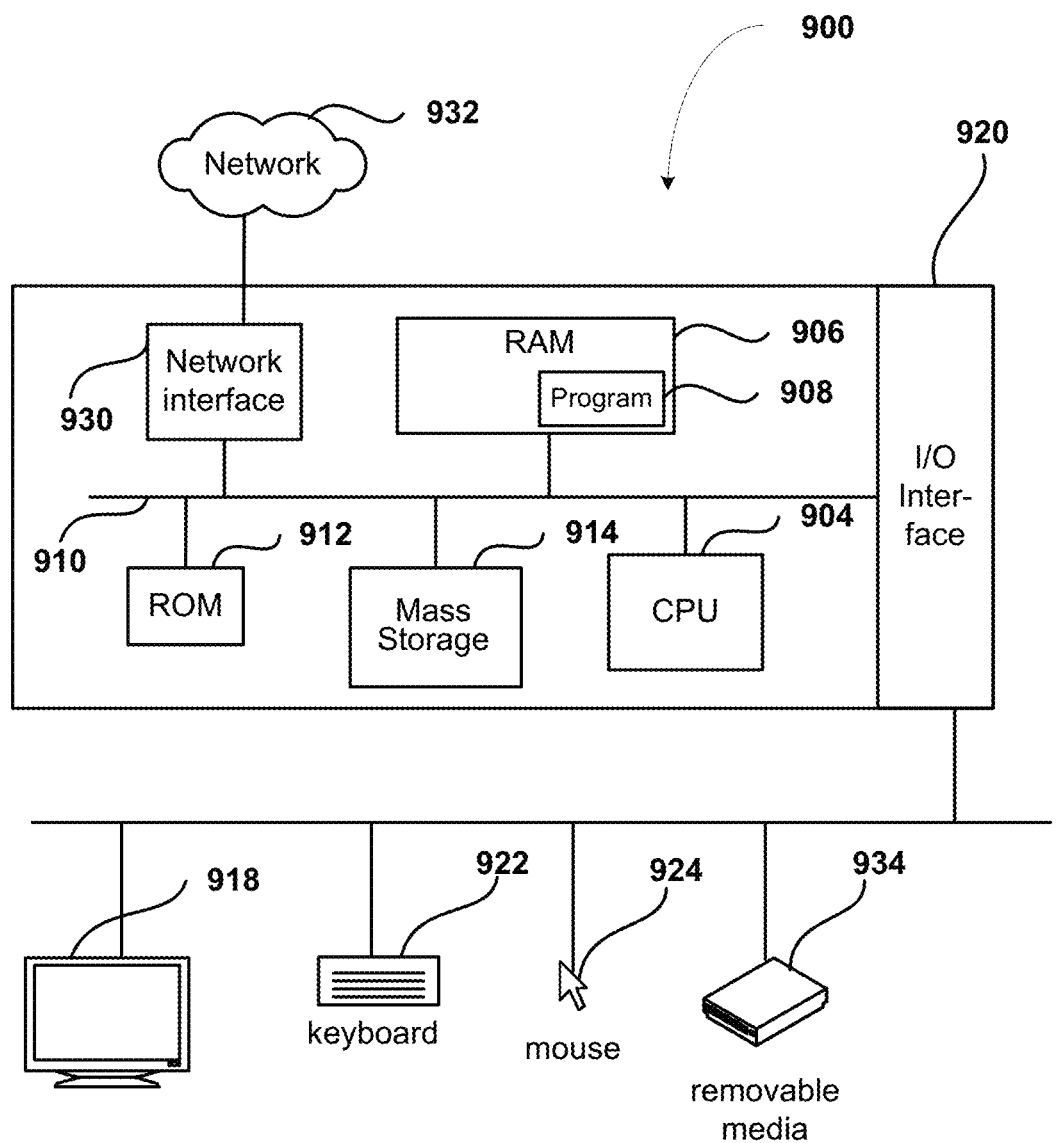
FIG. 9 is a simplified schematic diagram of a computer system for implementing embodiments of the present disclosure.

FIG. 9 is a simplified schematic diagram of a computer system 900 for implementing embodiments of the present disclosure. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 904, which is coupled through bus 910 to random access memory (RAM) 906, read-only memory (ROM) 912, and mass storage device 914. System controller program 908 resides in RAM 906, but can also reside in mass storage device 914.

Mass storage device 914 represents a persistent data storage device such as a floppy disc drive or a fixed disc drive, which may be local or remote. Network interface 930 provides connections via network 932, allowing communications with other devices. It should be appreciated that CPU 904 may be embodied in a general-purpose processor, a special purpose processor, or a specially programmed logic device. Input/Output (I/O) interface provides communication with different peripherals and is connected with CPU 904, RAM 906, ROM 912, and mass storage device 914, through bus 910. Sample peripherals include display 918, keyboard 922, cursor control 924, removable media device 934, etc.

Display 918 is configured to display the user interfaces described herein. Keyboard 922, cursor control (e.g., a mouse) 924, removable media device 934, and other peripherals are coupled to I/O interface 920 in order to communicate information in command selections to CPU 904. It should be appreciated that data to and from external devices may be communicated through I/O interface 920. The embodiments can also be practiced in distributed computing environments where tasks are performed by remote processing devices that are linked through a wire-based or wireless network.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

With the above embodiments in mind, it should be understood that the embodiments can employ various computer-implemented operations involving data stored in computer systems. These operations are those requiring physical manipulation of physical quantities. Any of the operations described herein that form part of the embodiments are useful machine operations. The embodiments also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they can occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A consumable part for use in a process chamber used to process a wafer, the consumable part comprising:
 a pocket defined on an underside surface of the consumable part that is facing away from a process region so as to leave the consumable part of at least a defined thickness between a bottom surface of the pocket and a top surface of the consumable part exposed to the process region, the pocket extending to a first depth and having an opening on the underside surface;
 a radio frequency tag disposed inside the pocket, the radio frequency tag is configured to generate a high frequency signal, when activated; and
 a plug covering the opening and extending to a second depth over the radio frequency tag, the second depth defined to leave a space between a bottom surface of the plug and a top surface of the radio frequency tag within the pocket, the plug is made of same material as the consumable part and is laser fused seal the radio frequency tag in the pocket, said laser fusion is performed along an interface defined between sidewalls of the plug and sidewalls of the pocket.

2. The consumable part of claim 1, wherein the laser fusion defines an air-tight seal of the interface using material from the sidewalls of the plug and the sidewalls of the pocket.

3. The consumable part of claim 1, wherein the radio frequency tag is an ultra-high frequency tag, wherein a frequency for the ultra-high frequency tag is selected to be greater than an operating frequency used for generating the plasma in the process chamber.

4. The consumable part of claim 3, wherein the frequency at which the radio frequency tag is operated is between about 150 Mega Hertz and about 1 Giga Hertz.

5. The consumable part of claim 3, wherein the operating frequency of the process chamber is between about 100 kilo Hertz and about 100 Mega Hertz.

6. The consumable part of claim 1, wherein the radio frequency tag is affixed to a bottom surface of the pocket using an adhesive, the adhesive is selected to withstand process conditions within the process chamber.

7. The consumable part of claim 1, wherein a first height of the consumable part where the pocket is defined is greater than the first depth of the pocket and the defined thickness of the consumable part, and wherein the defined thickness of the consumable part is greater than an amount of erosion experienced on the top surface of the consumable part during a lifetime of the consumable part.

8. The consumable part of claim 1, wherein the second depth of the plug is less than the first depth of the pocket.

9. The consumable part of the claim 1, wherein the plug and the consumable part are made of semi-opaque material with substantially same refractive index.

10. The consumable part of claim 9, wherein a refractive index of the interface is different from refractive indices of the plug and the consumable part, wherein said laser fusion is performed by tuning the refractive index of the interface.

11. The consumable part of claim 1, wherein the radio frequency tag is a passive tag.

12. The consumable part of claim 11, wherein the radio frequency tag is encapsulated within a ceramic shell.

13. The consumable part of claim 1, further includes,
a cooling element and the pocket is defined proximal to the cooling element.

* * * * *